(12) United States Patent
Sheppard et al.

(10) Patent No.: US 7,592,211 B2
(45) Date of Patent: Sep. 22, 2009

(54) METHODS OF FABRICATING TRANSISTORS INCLUDING SUPPORTED GATE ELECTRODES

(75) Inventors: Scott T. Sheppard, Chapel Hill, NC (US); Scott Allen, Apex, NC (US)

(73) Assignee: Cree, Inc., Durham, NC (US)

( * ) Notice: Subject to any disclaimer, the term of this patent is extended or adjusted under 35 U.S.C. 154(b) by 457 days.

(21) Appl. No.: 11/333,726

(22) Filed: Jan. 17, 2006

(65) Prior Publication Data

US 2007/0164321 A1    Jul. 19, 2007

(51) Int. Cl.
*H01L 21/338*    (2006.01)
(52) U.S. Cl. .............. 438/172; 438/182; 257/E21.403
(58) Field of Classification Search .............. 438/182
See application file for complete search history.

(56) References Cited

U.S. PATENT DOCUMENTS

| | | | |
|---|---|---|---|
| 2,938,136 A | 5/1960 | Fischer |
| 3,919,656 A | 11/1975 | Sokal et al. |
| 4,424,525 A | 1/1984 | Mimura |
| 4,471,366 A | 9/1984 | Delagebeaudeuf et al. |
| 4,551,905 A | 11/1985 | Chao et al. |
| 4,700,462 A | 10/1987 | Beaubien et al. |
| 4,727,403 A | 2/1988 | Hilda et al. |
| 4,755,867 A | 7/1988 | Cheng |
| 4,788,156 A | 11/1988 | Stoneham et al. |
| 4,946,547 A | 8/1990 | Palmour et al. |
| 4,947,232 A | 8/1990 | Ashida et al. |
| 5,006,914 A | 4/1991 | Beetz, Jr. |
| 5,030,583 A | 7/1991 | Beetz, Jr. |
| 5,030,586 A | 7/1991 | Matsuda et al. |
| 5,053,348 A | 10/1991 | Mishra et al. |
| 5,057,897 A | 10/1991 | Nariani et al. |
| 5,128,279 A | 7/1992 | Nariani et al. |
| 5,172,197 A | 12/1992 | Nguyen et al. |
| 5,181,087 A | 1/1993 | Usagawa et al. |
| 5,192,987 A | 3/1993 | Khan et al. |
| 5,196,359 A | 3/1993 | Shih et al. |

(Continued)

FOREIGN PATENT DOCUMENTS

EP    0069429 A    1/1983

(Continued)

OTHER PUBLICATIONS

Notification of Transmittal of the International Search Report and the Written Opinion of the International Searching Authority, or the Declaration corresponding to International Application No. PCT/US2007/001045 mailed Jun. 15, 2007.

(Continued)

*Primary Examiner*—Stephen W Smoot
(74) *Attorney, Agent, or Firm*—Myers Bigel Sibley & Sajovec, P.A.

(57) ABSTRACT

Transistors are fabricated by forming a protective layer having an opening extending therethrough on a substrate, and forming a gate electrode in the opening. A first portion of the gate electrode laterally extends on surface portions of the protective layer outside the opening, and a second portion of the gate electrode is spaced apart from the protective layer and laterally extends beyond the first portion. Related devices and fabrication methods are also discussed.

13 Claims, 5 Drawing Sheets

U.S. PATENT DOCUMENTS

| | | | |
|---|---|---|---|
| 5,200,022 A | 4/1993 | Kong et al. |
| 5,210,051 A | 5/1993 | Carter, Jr. |
| 5,223,458 A | 6/1993 | Shanfield et al. |
| 5,292,501 A | 3/1994 | Degenhardt et al. |
| 5,296,395 A | 3/1994 | Khan et al. |
| 5,298,445 A | 3/1994 | Asano |
| 5,311,055 A | 5/1994 | Goodman et al. |
| 5,364,816 A | 11/1994 | Boos et al. |
| 5,373,171 A | 12/1994 | Imai et al. |
| 5,382,822 A | 1/1995 | Stein |
| RE34,861 E | 2/1995 | Davis et al. |
| 5,393,993 A | 2/1995 | Edmond et al. |
| 5,399,886 A | 3/1995 | Hasegawa |
| 5,422,901 A | 6/1995 | Lebby et al. |
| 5,523,589 A | 6/1996 | Edmond et al. |
| 5,534,462 A | 7/1996 | Fiordalice et al. |
| 5,592,501 A | 1/1997 | Edmond et al. |
| 5,661,312 A | 8/1997 | Weitzel et al. |
| 5,686,737 A | 11/1997 | Allen |
| 5,688,704 A | 11/1997 | Liu |
| 5,693,560 A * | 12/1997 | Hattori et al. ............... 257/473 |
| 5,700,714 A | 12/1997 | Ogilhara et al. |
| 5,701,019 A | 12/1997 | Matsumoto et al. |
| 5,705,827 A | 1/1998 | Baba et al. |
| 5,804,482 A | 9/1998 | Konstantinov et al. |
| 5,872,415 A | 2/1999 | Dreifus et al. |
| 5,885,860 A | 3/1999 | Weitzel et al. |
| 5,946,547 A | 8/1999 | Kim et al. |
| 5,966,520 A | 10/1999 | Buer et al. |
| 6,028,328 A | 2/2000 | Riechert et al. |
| 6,033,948 A | 3/2000 | Kwon et al. |
| 6,046,464 A | 4/2000 | Schetzina |
| 6,051,849 A | 4/2000 | Davis et al. |
| 6,060,734 A | 5/2000 | Kunihiro |
| 6,064,082 A | 5/2000 | Kawai et al. |
| 6,086,673 A | 7/2000 | Molnar |
| 6,087,256 A | 7/2000 | Wada |
| 6,100,571 A | 8/2000 | Mizuta et al. |
| 6,150,239 A | 11/2000 | Goesele et al. |
| 6,150,680 A | 11/2000 | Eastman et al. |
| 6,156,581 A | 12/2000 | Vaudo et al. |
| 6,177,685 B1 | 1/2001 | Teraguchi et al. |
| 6,177,688 B1 | 1/2001 | Linthicum et al. |
| 6,184,142 B1 | 2/2001 | Chung et al. |
| 6,218,680 B1 | 4/2001 | Carter, Jr. et al. |
| 6,242,327 B1 | 6/2001 | Yokoyama et al. |
| 6,246,076 B1 | 6/2001 | Lipkin et al. |
| 6,255,198 B1 | 7/2001 | Linthicum et al. |
| 6,261,929 B1 | 7/2001 | Gehrke et al. |
| 6,297,092 B1 | 10/2001 | Rudeck et al. |
| 6,307,232 B1 | 10/2001 | Akiyama et al. |
| 6,316,793 B1 | 11/2001 | Sheppard et al. |
| 6,316,826 B1 | 11/2001 | Yamamoto et al. |
| 6,346,451 B1 | 2/2002 | Simpson et al. |
| 6,376,339 B2 | 4/2002 | Linthicum et al. |
| 6,380,108 B1 | 4/2002 | Linthicum et al. |
| 6,396,864 B1 | 5/2002 | O'Brien et al. |
| 6,403,456 B1 | 6/2002 | Plat et al. |
| 6,429,467 B1 | 8/2002 | Ando |
| 6,445,038 B1 | 9/2002 | Tihanyi |
| 6,448,648 B1 | 9/2002 | Boos |
| 6,462,355 B1 | 10/2002 | Linthicum et al. |
| 6,465,814 B2 | 10/2002 | Kasahara et al. |
| 6,468,878 B1 | 10/2002 | Petruzzello et al. |
| 6,483,135 B1 | 11/2002 | Mizuta et al. |
| 6,486,042 B2 | 11/2002 | Gehrke et al. |
| 6,489,221 B2 | 12/2002 | Gehrke et al. |
| 6,492,669 B2 | 12/2002 | Nakayama et al. |
| 6,497,763 B2 | 12/2002 | Kub et al. |
| 6,504,235 B2 | 1/2003 | Schmitz et al. |
| 6,515,316 B1 | 2/2003 | Wojtowicz et al. |
| 6,521,514 B1 | 2/2003 | Gehrke et al. |
| 6,522,587 B1 | 2/2003 | Furuhata et al. |
| 6,533,874 B1 | 3/2003 | Vaudo et al. |
| 6,545,300 B2 | 4/2003 | Gehrke et al. |
| 6,548,333 B2 | 4/2003 | Smith |
| 6,559,513 B1 | 5/2003 | Miller et al. |
| 6,570,192 B1 | 5/2003 | Davis et al. |
| 6,582,906 B1 | 6/2003 | Cao et al. |
| 6,582,986 B2 | 6/2003 | Kong et al. |
| 6,583,454 B2 | 6/2003 | Sheppard et al. |
| 6,586,778 B2 | 7/2003 | Linthicum et al. |
| 6,586,781 B2 | 7/2003 | Wu et al. |
| 6,586,813 B2 | 7/2003 | Nagahara |
| 6,602,763 B2 | 8/2003 | Davis et al. |
| 6,602,764 B2 | 8/2003 | Linthicum et al. |
| 6,608,327 B1 | 8/2003 | Davis et al. |
| 6,620,688 B2 | 9/2003 | Woo et al. |
| 6,621,148 B2 | 9/2003 | Linthicum et al. |
| 6,634,770 B2 | 10/2003 | Cao |
| 6,639,255 B2 | 10/2003 | Inoue et al. |
| 6,670,693 B1 | 12/2003 | Quick |
| 6,677,642 B2 | 1/2004 | Peake et al. |
| 6,686,261 B2 | 2/2004 | Gehrke et al. |
| 6,686,676 B2 | 2/2004 | McNulty et al. |
| 6,692,568 B2 | 2/2004 | Cuomo et al. |
| 6,706,114 B2 | 3/2004 | Mueller |
| 6,757,314 B2 | 6/2004 | Kneissl et al. |
| 6,768,147 B2 | 7/2004 | Yokoyama et al. |
| 6,844,592 B2 | 1/2005 | Yamaguchi et al. |
| 6,849,882 B2 | 2/2005 | Chavarkar et al. |
| 6,867,067 B2 | 3/2005 | Ghyselen et al. |
| 6,867,078 B1 | 3/2005 | Green et al. |
| 7,008,832 B1 | 3/2006 | Subramanian et al. |
| 7,012,014 B2 | 3/2006 | Lin et al. |
| 7,030,428 B2 | 4/2006 | Saxler |
| 7,045,404 B2 | 5/2006 | Sheppard et al. |
| 7,075,125 B2 | 7/2006 | Saito et al. |
| 7,221,039 B2 | 5/2007 | Huang et al. |
| 2001/0015446 A1 | 8/2001 | Inoue et al. |
| 2001/0017370 A1 | 8/2001 | Sheppard et al. |
| 2001/0020700 A1 | 9/2001 | Inoue et al. |
| 2001/0023964 A1 | 9/2001 | Wu et al. |
| 2001/0040246 A1 | 11/2001 | Ishii |
| 2002/0008241 A1 | 1/2002 | Edmond et al. |
| 2002/0017696 A1 | 2/2002 | Nakayama et al. |
| 2002/0066908 A1 | 6/2002 | Smith |
| 2002/0078881 A1 | 6/2002 | Cuomo et al. |
| 2002/0086106 A1 | 7/2002 | Park et al. |
| 2002/0086534 A1 | 7/2002 | Cuomo et al. |
| 2002/0096104 A1 | 7/2002 | Yagi et al. |
| 2002/0117695 A1 | 8/2002 | Borges et al. |
| 2002/0119610 A1 | 8/2002 | Nishii et al. |
| 2002/0123204 A1 | 9/2002 | Torvik |
| 2002/0167023 A1 | 11/2002 | Chavarkar et al. |
| 2002/0180351 A1 | 12/2002 | McNulty et al. |
| 2002/0182779 A1 | 12/2002 | Bewley et al. |
| 2003/0006437 A1 | 1/2003 | Mizuta et al. |
| 2003/0017683 A1 | 1/2003 | Emrick et al. |
| 2003/0020092 A1 | 1/2003 | Parikh et al. |
| 2003/0025198 A1 | 2/2003 | Chrysler et al. |
| 2003/0096507 A1 | 5/2003 | Baker et al. |
| 2003/0102482 A1 | 6/2003 | Saxler |
| 2003/0107045 A1 | 6/2003 | Eisert et al. |
| 2003/0123829 A1 | 7/2003 | Taylor |
| 2003/0127654 A1 | 7/2003 | Eisert et al. |
| 2003/0157776 A1 | 8/2003 | Smith |
| 2003/0213975 A1 | 11/2003 | Hirose et al. |
| 2003/0219959 A1 | 11/2003 | Ghyselen et al. |
| 2004/0004223 A1 | 1/2004 | Nagahama et al. |
| 2004/0009649 A1 | 1/2004 | Kub et al. |
| 2004/0012015 A1 | 1/2004 | Saxler |
| 2004/0021152 A1 | 2/2004 | Nguyen et al. |
| 2004/0023468 A1 | 2/2004 | Ghyselen et al. |

| | | | |
|---|---|---|---|
| 2004/0029330 A1 | 2/2004 | Hussain et al. | |
| 2004/0036086 A1 | 2/2004 | Khan et al. | |
| 2004/0051141 A1 | 3/2004 | Udrea | |
| 2004/0061129 A1 | 4/2004 | Saxler et al. | |
| 2004/0070003 A1 | 4/2004 | Gaska et al. | |
| 2004/0241970 A1 | 12/2004 | Ring | |
| 2005/0006639 A1 | 1/2005 | Dupuis et al. | |
| 2005/0051796 A1 | 3/2005 | Parikh et al. | |
| 2005/0059197 A1 | 3/2005 | Yamashita et al. | |
| 2005/0164482 A1 | 7/2005 | Saxler | |
| 2005/0170574 A1 | 8/2005 | Sheppard et al. | |
| 2006/0011915 A1 | 1/2006 | Saito et al. | |
| 2006/0071247 A1 | 4/2006 | Chen et al. | |
| 2006/0145761 A1 | 7/2006 | Pribble et al. | |
| 2007/0018199 A1 | 1/2007 | Sheppard et al. | |

FOREIGN PATENT DOCUMENTS

| | | | |
|---|---|---|---|
| EP | 0 334 006 A1 | 9/1989 | |
| EP | 0 563 847 A2 | 10/1993 | |
| EP | 0792028 A2 | 8/1997 | |
| EP | 1336989 A2 | 8/2003 | |
| JP | 3295267 | 12/1991 | |
| JP | 05021793 | 1/1993 | |
| JP | 10-050982 | 2/1998 | |
| JP | 11261053 | 9/1999 | |
| JP | 2001085670 | 3/2001 | |
| JP | 2001230407 A | 8/2001 | |
| JP | 2002016087 A | 1/2002 | |
| JP | 2002265296 | 9/2002 | |
| JP | 2003037074 | 2/2003 | |
| JP | 2003257804 | 9/2003 | |
| JP | 2004-342810 | 12/2004 | |
| WO | WO 93/23877 A1 | 11/1993 | |
| WO | WO 00/04587 A2 | 1/2000 | |
| WO | WO 01/57929 A1 | 8/2001 | |
| WO | WO 03/038905 A2 | 5/2003 | |
| WO | WO 03036699 | 5/2003 | |
| WO | WO 03/049193 A1 | 6/2003 | |
| WO | WO 2004/008495 | 1/2004 | |
| WO | WO 2004/068590 A1 | 8/2004 | |
| WO | WO 2005/024909 | 3/2005 | |
| WO | WO 2005/029589 A1 | 3/2005 | |

OTHER PUBLICATIONS

U.S. Appl. No. 10/201,345, filed Jul. 23, 2002, Parikh et al.
U.S. Appl. No. 10/930,160, filed Aug. 31, 2004, Parikh.
U.S. Appl. No. 10/772,882, filed Feb. 5, 2004, Saxler.
U.S. Appl. No. 10/849,589, filed May 20, 2004, Saxler.
U.S. Appl. No. 10/849,617, filed May 20, 2004, Saxler.
U.S. Appl. No. 10/897,726, filed Jul. 23, 2004, Sheppard.
U.S. Appl. No. 10/976,422, filed Oct. 29, 2004, Wu.
U.S. Appl. No. 10/996,249, filed Nov. 23, 2004, Saxler.
U.S. Appl. No. 10/856,098, filed May 28, 2004, Mishra.
U.S. Appl. No. 11/005,107, filed Dec. 6, 2004, Parikh.
U.S. Appl. No. 11/078,265, filed Mar. 11, 2005, Wu et al.
U.S. Appl. No. 10/752,970, filed Jan. 7, 2004, Saxler.
U.S. Appl. No. 10/899,215, filed Jul. 26, 2004, Saxler et al.
U.S. Appl. No. 10/707,898, filed Jan. 22, 2004, Saxler.
U.S. Appl. No. 11/080,905, filed Mar. 15, 2005, Smith et al.
U.S. Appl. No. 11/118,575, filed Apr. 29, 2005, Saxler.
U.S. Appl. No. 11/118,675, filed Apr. 29, 2005, Saxler.
U.S. Appl. No. 11/103,127, filed Apr. 11, 2005, Saxler.
U.S. Appl. No. 11/103,117, filed Apr. 11, 2005, Saxler et al.
Sheppard et al., "Improved 10-GHz Operation GaN/AlGaN HEMTs on Silicon Carbide", *Materials Science Forum*, vols. 338-342 (2000) pp. 1643-1646.
Sheppard et al., "High Power Demonstration at 10 GHz with GaN/AlGaN HEMT Hybrid Amplifiers", *Presented at the 58th DRC*, Denver, CO (Jun. 2000) 20 pages.
Beaumont, B. et al., "Epitaxial Lateral Overgrowth of GaN," *Phys. Stat. Sol.* (b) 227, No. 1, pp. 1-43 (2001).

Ando et al., "10-W/mm AlGaN-GaN HFET With a Field Modulating Plate," *IEEE Electron Device Letters*, 24(5), pp. 289-291 (May 2003).
Chang et al., "AlGaN/GaN Modulation-Doped Field-Effect Transistors with an Mg-doped Carrier Confinement Layer," *Jpn. J. Appl. Phys.*, 42:3316-3319 (2003).
Chini et al., "Power and Linearity Characteristics of Field-Plated Recessed-Gate AlGaN-GaN HEMTs," *IEEE Electron Device Letters*, 25(5), pp. 229-231 (May 2004).
Cho et al., "A New GaAs Field Effect Transistors (FET) with Dipole Barrier (DIB)," *Jpn. J. Appl. Phys.* 33:775-778 (1994).
Coffie et al., "Unpassivated p-GaN/AlGaN/GaN HEMTs with 7.1 W/MMF at 10 GHz", *Electronic Letters online* No. 20030872, 39(19), (Sep. 18, 2003).
Gaska et al., "Self-Heating in High-Power AlGaN/GaN HFET's," *IEEE Electron Device Letters*, 19(3), pp. 89-91 (Mar. 1998).
Hikita et al., "350V/150A AlGaN/GaN Power HFET on Silicon Substrate With Source-via Grounding (SVG) Structure," *Electron Devices Meeting*, 2004, pp. 803-806, IEDM Technical Digest. IEEE International (Dec. 2004).
Kanaev et al., "Femtosecond and Ultraviolet Laser Irradiation of Graphitelike Hexagonal Boron Nitride," *Journal of Applied Physics*, 96(8), pp. 4483-4489 (Oct. 15, 2004).
Kanamura et al., "A 100-W High-Gain AlGaN/Gan HEMT Power Amplifier on a Conductive N-SiC Substrate for Wireless Base Station Applications," *Electron Devices Meeting*, 2004, pp. 799-802, IEDM Technical Digest. IEEE International (Dec. 2004).
Karmalkar et al., "Very High Voltage AlGaN/GaN High Electron Mobility Transistors Using a Field Plate Deposited on a Stepped Insulator," *Solid State Electronics*, vol. 45, pp. 1645-1652 (2001).
Kashahara et al., "Ka-ban 2.3W Power AlGaN/GaN Heterojunction FET," *IEDM Technical Digest*, pp. 677-680 (2002).
Komiak et al., "Fully Monolithic 4 Watt High Efficiency Ka-band Power Amplifier," *IEEE MTT-S International Microwave Symposium Digest*, vol. 3, pp. 947-950 (1999).
Küsters et al., "Double-Heterojunction Lattice-Matched and Pseudomorphic InGaAs HEMT with δ-Doped InP Supply Layers and p-InP Barier Enhancement Layer Grown by LP-MOVPE," *IEEE Electron Device Letters*, 14(1), (Jan. 1993). pp. 36-39.
Manfra et al., "Electron Mobility Exceeding 160 000 $cm^2/V$ s in AlGaN/GaN Heterostructures Grown by Molecular-beam Epitaxy," *Applied Physics Letters*, 85(22), pp. 5394-5396 (Nov. 29, 2004).
Manfra et al., "High Mobility AlGaN/GaN Heterostructures Grown by Plasma-assisteed Molecular beam epitaxy on Semi-Insulating GaN Templates Prepared by Hydride Vapor Phase Epitaxy," *Journal of Applied Physics*, 92(1), pp. 338-345 (Jul. 1, 2002).
Manfra et al., "High-Mobility AlGaN/GaN Heterostuctures Grown by Molecular-beam Epitaxy on GaN Templates Prepared by Hydride Vapor Phase Epitaxy," *Applied Physics Letters*, 77(18), pp. 2888-2890 (Oct. 30, 2000).
Parikh et al., "Development of Gallium Nitride Epitaxy and Associated Material-Device Correlation for RF, Microwave and MM-wave Applications," Cree, Inc. (35 slides).
Saxler et al., "III-Nitride Heterostructures on High-Purity Semi-Insulating 4H-SiC Substrates for High-Power RF Transistors," International Workshop on Nitride Semiconductors (Jul. 19, 2004).
Shiojima et al., "Improved Carrier Confinement by a Buried p-Layer in the AlGaN/GaN HEMT Structure," *IEICE Trans. Electron.*, E83-C(12), (Dec. 2000).
"Thick AIN template on SiC substrate—Novel semi insulating substrate for GaN-based devices," © 2003 by TDI, Inc., http://www.tdii.com/products/AIN_SiCT.html.
Tilak et al., "Influence of Barrier Thickness on the High-Power Performance of AlGaN/GaN HEMTs," *IEEE Electron Device Letters*, 22(11), pp. 504-506 (Nov. 2001).
Walker, J. L. B. (Ed.), *High Power GaAs FET Amplifiers*, Norwood, MA: Artech House, pp. 119-120 (1993).
Wu et al., "3.5-Watt AlGaN/GaN HEMTs and Amplifiers at 35 GHz," IEDM-2003, Cree, Inc.
Wu et al., "3.5-Watt AlGaN/GaN HEMTs and Amplifiers at 35 GHz," Cree Santa Barbara Technology Center, Goleta, CA 93117.
Wu et al., "30-W/mm GaN HEMTs by Field Plate Optimization," *IEEE Electron Device Letters*, 25(3), pp. 117-119 (Mar. 2004).

Wu et al., "Bias-dependent Performance of High-Power AlGaN/GaN HEMTs," *IEDM Technical Digest*, p. 378-380 (2001).

Wu et al., "Linearity Performance of GaN HEMTs With Field Plates," DRC 2004, Cree, Inc.

Wu et al., "Linearity Performance of GaN HEMTs With Field Plates," Cree Santa Barbara Technology Center, Goleta, CA 93117.

Yu et al., "Schottky Barrier Engineering in III-V Nitrides via the Piezoelectric Effect," *Applied Physics Letters*, 73(13), pp. 1880-1882 (Sep. 28, 1998).

Zhang et al., "High Breakdown GaN HEMT with Overlapping Gate Structure," *IEEE Electron Device Letters*, 21(9), pp. 421-423 (Sep. 2000).

Ambacher et al., "Two Dimensional Electron Gases Induced by Spontaneous and Piezoelectric Polarization Charges in N- and Ga-face AlGaN/GaN Heterostructures," *Journal of Applied Physics*. vol. 85, No. 6, pp. 3222-3233 (Mar. 1999).

Ben-Yaacov et al., "AlGaN/GaN Current Aperture Vertical Electron Transistors with Regrown Channels," *Journal of Applied Physics*. vol. 95, No. 4, pp. 2073-2078 (2004).

Burm et al. "Ultra-Low Resistive Ohmic Contacts on *n*-Gan Using Si Implantation," *Applied Physics Letters*. vol. 70, No. 4, 464-66 (1997).

Heikman, et al., "Mass Transport Regrowth of GaN for Ohmic Contacts to AlGaN/GaN," *Applied Physics Letters*. vol. 78, No. 19, pp. 2876.

Shen et al., "High-Power Polarization-Engineered GaN/AlGaN/GaN HEMTs Without Surface Passivation," *IEEE Electronics Device Letters*. vol. 25, No. 1, pp. 7-9 (2004).

Asbeck et al. "Piezoelectric charge densities in AlGaN/GaN HFETs," *Elecronics Letters*. vol. 33, No. 14, pp. 1230-1231 (1997).

Breitschadel et al. "Minimization of Leakage Current of Recessed Gate AlGaN/GaN HEMTs by Optimizing the Dry-Etching Process," *Journal of Electronic Materials*. vol. 28, No. 12, pp. 1420-1423 (1999).

Burm et al. "Recessed Gate GaN MODFETS," *Solid-State Electronics*. vol. 41, No. 2, pp. 247-250 (1997).

Chen et al. "Cl2 reactive ion etching for gate recessing of AlGaN/GaN field-effect transistors," *J. Vac. Sci. Technol. B*. vol. 17, No. 6, pp. 2755-2758 (1999).

Eastman et al. "GaN materials for high power microwave amplifiers," *Mat. Res. Soc. Symp. Proc*. vol. 512 (1998) pp. 3-7.

Eastman et al. "Undoped AlGaN/GaN HEMTs for Microwave Power Amplification," *IEEE Transactions on Electron Devices*. vol. 48, No. 3, pp. 479-485 (Mar. 2001).

Egawa et al. "Recessed gate ALGaN/GaN MODFET on Sapphire Grown by MOCVD," *Applied Physics Letters*. vol. 76, No. 1, pp. 121-123 (Jan. 2000).

Gaska et al. "High-Temperature Performance of AlGaN/GaN HFET's on SiC Substrates," *IEEE Electron Device Letters*. vol. 18, No. 10, pp. 492-494 (Oct. 1997).

Gaska et al. "Electron Transport in AlGaN/GaN Heterostructures Grown on 6H-SiC Substrates," *Applied Physics Letter*. vol. 72, No. 6, pp. 707-709 (Feb. 1998).

Gelmont et al. "Monte Carlo simulation of electron transport in gallium nitride," *Journal of Applied Physics*. vol. 74, No. 3, pp. 1818-1821 (Aug. 1993).

Heikman et al. "Polarization Effects in AlGaN/GaN and GaN/AlGaN/GaN heterostructures," *Journal of Applied Physics*. vol. 93, No. 12, pp. 10114-10118 (Jun. 2003).

Heikman et al., "Growth of Fe-Doped Semi-insulating GaN by Metalorganic Chemical Vapor Deposition," *Applied Physics Letters*. vol. 83, No. 1, pp. 439-441 (Jul. 2002).

Heikman, Sten J., *MOCVD Growth Technologies for Applications in AlGaN/GaN High Electron Mobility Transistors, Dissertation*, University of California—Santa Barbara, Sep. 2002, 190 pages.

Karmalkar et al. "Enhancement of Breakdown Voltage in AlGaN/GaN High Electron Mobility Transistors Using a Field Plate," *IEEE Transactions on Electron Devices*. vol. 48, No. 8, pp. 1515-1521 (Aug. 2001).

Karmalkar et al. "RESURF AlGaN/GaN HEMT for High Voltage Power Switching," *IEEE Electron Device Letters*. vol. 22, No. 8, pp. 373-375 (Aug. 2001).

Kuzmik et al. "Annealing of Schottky contacts deposited on dry etched AlGaN/Gan," *Semiconductor Science and Technology*. vol. 17, No. 11 (Nov. 2002).

Neuburger et al. "Design of GaN-based Field Effect Transistor Structures based on Doping Screening of Polarization Fields," WA 1.5, 7$^{th}$ Wide-Bandgap III-Nitride Workshop (Mar. 2002).

Ping et al. "DC and Microwave Performance of High-Current AlGaN/GaN Heterostructure Field Effect Transistors Grown on p-Type SiC Substrates," *IEEE Electron Device Letters*. vol. 19, No. 2, pp. 54-56 (Feb. 1998).

Sriram et al. "RF Performance of AlGaN/GaN MODFET's on High Resistivity SiC Substrates," Presentation at Materials Research Society Fall Symposium, 1997.

Sriram et al. "SiC and GaN Wide BandGap Microwave Power Transistors," *IEEE Samoff Symposium*, Pittsburgh, PA, Mar. 18, 1998.

Sullivan et al. "High-Power 10-GHz Operation of AlGaN HFET's on Insulating SiC," *IEEE Electron Device Letters*. vol. 19, No. 6, pp. 198-200 (Jun. 1998).

Wu et al. "High Al-Content AlGaN/GaN MODFET's for Ultrahigh Performance," *IEEE Electron Device Letters*. vol. 19, No. 2, pp. 50-53 (Feb. 1998).

Dang et al. "Influence of surface processing and passivation on carrier concentrations and transport properties in AlGaN/GaN heterostructures", *J. Appl. Phys*. 90(3):1357-1361 (2001).

Khan et al. "AlGaN/GaN Metal Oxide Semiconductor Heterostructure Field Effect Transistor", *IEEE Electron Device Letters* 21(2):63-65 (2000).

Simin et al. "SiO$_2$/AlGan/InGaN/GaN MOSDHFETs", *IEEE Electron Device Letters* 23(8):458-460 (2002).

Yoshida et al. "Improvement of Endurance to Hot Carrier Degradation by Hydrogen Blocking P-SIO", *IEDM* 88:22-25 (IEEE 1988).

Hu et al. "Si$_3$N$_4$/AlGaN/GaN-metal-insulator-semiconductor heterostructure field-effect transistor", *Applied Physics Letters, Am. Institute of Physics* 79(17):2832-2834 (2001).

Dorf "The Electrical Engineering Handbook 2d Edition" *CRC Press* p. 994 (1997).

Saito et al. "High Breakdown Voltage AlGaN-Gan Power-HEMT Design and High Current Density Switching Behavior", *IEEE Transactions on Electron Devices* 50(12):2528-2531 (2003).

Micovic et al. "AlGaN/GaN Heterojunction Field Effect Transistors Grown by Nitrogen Plasma Assisted Molecular Beam Epitaxy", *IEEE Transactions on Electron Devices* 48(3):591-596 (2001).

Saito et al. "600V AlGaN/GaN Power-HEMT: Design, Fabrication and Demonstration on High Voltage DC-DC Converter", *IEEE IEDM* 23(7):587-590 (2003).

Wu et al. "High-gain Microwave Gan HEMTs with Source-terminated Field-plates", *Cree Santa Barbara Technology Center* 2 pages, 2004.

Wu et al. "Very-High Power Density AlGaN/GaN HEMTS", *IEEE Transactions on Electron Devices* 48(3):586-590 (2001).

Saito et al. "Design and Demonstration of High Breakdown Voltage GaN High Electron Mobility Transistor (HEMT) using Field Plate Structure for Power Electronics Applications", *Japanese J. of Applied Phys*. 43(4B):2239-2242 (2004).

Li et al. "High Breakdown Voltage GaN HFET with Field Plate", *Electronics Letters* 37(3):196-197 (2001).

Xing et al. "Breakdown Voltage AlGaN-GaN HEMTs Achieved by Multiple Field Plates", *IEEE Electron Devices Letters* 25(4):161-163 (2004).

Mok et al. "A Novel High-Voltage High-Speed MESFET Using a Standard GaAs Digital IC Process", *IEEE Transactions on Electron Devices* 41(2):246-250 (1994).

Saito et al. "Theoretical Limit Estimation of Lateral Wide Band-Gap Semiconductor Power-Switching Device", *Solid State Electronics* 48:1555-1562 (2003).

Asano et al. "Novel High Power AlGaAs/GaAs HFET with a Field-Modulating Plate Operated at 35V Drain Voltage", *IEEE IEDM* 98:59-62 (1998).

Wakejima et al. "High Power Density and Low Distortion INGAP Channel FETs with Field-Modulating Plate", *IEICE Transactions on Electronics* E85-C(12):2041-2045 (2002).

Wu et al. "GaN-Based FETs for Microwave Power Amplification", *IEICE Transactions on Electronics* E85-C:1895-1905 (1999).

Celler et al. "frontiers of Silicon-on-Insulator" *Journal of Applied Physics* 93(9):4955 (2003).

Elhamri et al. "Persistent Photoconductivity in a High Mobility Two Dimensional Electron Gas in an AlGaN/GaN Heterostructure" *Materials Research Society Symposium Procedures* vol. 639 pp. G7.6.1-G7.6.6 (2001).

Gaskill et al. "Summary of the Workshop on Bonded and Compliant Substrates" *MRS Internet Journal Nitride Semiconductor Research* 2 pages, Mar. 4, 1998.

Moriceau et al. "new Layer Transfers Obtained by the SmartCut Process" *Journal of Elcetronic Materials* 32(8): 829-835 (2003).

Palacios et al. "AlGaN/GaN HEMTs with an InGaN-Based Back-Barrier" *Device Research Conference Digest*, 2005. DRC '05. $63^{rd}$ 1: 181-182 (2005).

Palacios et al. "AlGaN/GaN High Electron Mobility Transistors With InGaN Back-Barriers" *IEEE Electron Devices Letters* 27(1): 13-15 (2006).

Pribble et al. "Applications of SiC MESFETS and GaN HEMTs in Power Amplifier Design" *2002 IEEE MTT-S Digest* 30:1819-1822 (2002).

RadioElectronics.com "The High Electron Mobility Transistor (HEMT)" website. <http://www.radio-electronics.com/info/data.semicond.hemt/hemt.php> accessed on Nov. 2, 2005.

Saxler et al. Electroluminescence of III_Nitride Double Heterostructure Light Emitting Diodes with Silicon and Magnesium Doped InGaN *Materials Science Forum* vols. 258-263 pp. 1229-1234 (1997).

Khan et al. "High electron mobility transistor based on a GaN-$Al_xGa_{1-x}N$ heterojunction" *Applied Physics Letters* 63(9): 1214-1215 (1993).

Lyons et al. "Design of Low-Cost 4W & 6W MMIC High Power Amplifiers for Ka-Band Modules" *IEEE MTT-S/IMS Proceedings* pp. 1673-1676 (2004).

Palacios et al. High-Power AlGaN/Gan HEMTs for Ka-Band Applications *IEEE Electron Device Letters* 26(11): 781-783 (2005).

Saunier "GaN Technology Overview: Accomplishments and Challenges" $12^{th}$ *GAAS Symposium—Amsterdam*, 2004 pp. 543-546 (2004).

Thompson et al. "Performance of the AlGaN HEMT Structure with a Gate Extension" *IEEE Transactions on Electron Devices* 51(2): 292-295 (2004).

Wu et al. "Measured Microwave Power Performance of AlGaN/GaN MODFET" *IEEE Electron Device Letters* 17(9):455-457 (1996).

U.S. Appl. No. 10/958,970, filed Oct. 4, 2004, Yifeng Wu.
U.S. Appl. No. 10/851,507, filed May 22, 2004, Richard Smith.
U.S. Appl. No. 11/132,619, filed May 15, 2005.
U.S. Appl. No. 11/078,265, filed Mar. 11, 2005.
U.S. Appl. No. 11/005,423, filed Dec. 6, 2004, Primit Parikh.
U.S. Appl. No. 11/360,876, filed Feb. 23, 2006, Yifeng Wu.
U.S. Appl. No. 11/357,752, filed Feb. 17, 2006, Saxler et al.

* cited by examiner

METHODS OF FABRICATING TRANSISTORS INCLUDING SUPPORTED GATE ELECTRODES

FIELD OF THE INVENTION

The present invention relates to semiconductor devices, and, more particularly, to methods of fabricating transistors and related devices.

BACKGROUND OF THE INVENTION

Materials such as silicon (Si) and gallium arsenide (GaAs) have found wide application in semiconductor devices for lower power and, in the case of Si, lower frequency applications. However, these more familiar semiconductor materials may not be well suited for higher power and/or high frequency applications, for example, due to their relatively small bandgaps (e.g., 1.12 eV for Si and 1.42 for GaAs at room temperature) and/or relatively small breakdown voltages.

In light of the difficulties presented by Si and GaAs, interest in high power, high temperature and/or high frequency applications and devices has turned to wide bandgap semiconductor materials such as silicon carbide (2.996 eV for alpha SiC at room temperature) and the Group III nitrides (e.g., 3.36 eV for GaN at room temperature). These materials, typically, may have higher electric field breakdown strengths and higher electron saturation velocities as compared to gallium arsenide and/or silicon.

A device of particular interest for high power and/or high frequency applications is the High Electron Mobility Transistor (HEMT), which is also known as a modulation doped field effect transistor (MODFET). In a HEMT device, a two-dimensional electron gas (2DEG) may be formed at the heterojunction of two semiconductor materials with different bandgap energies. The smaller bandgap material may have a higher electron affinity than the wider bandgap material. The 2DEG is an accumulation layer in the undoped ("unintentionally doped") smaller bandgap material, and can contain a relatively high sheet electron concentration, for example, in excess of $10^{13}$ carriers/cm$^2$. Additionally, electrons that originate in the wider bandgap semiconductor may transfer to the 2DEG, allowing a relatively high electron mobility due to reduced ionized impurity scattering. This combination of relatively high carrier concentration and relatively high carrier mobility can give the HEMT a relatively large transconductance, and may provide a performance advantage over metal-semiconductor field effect transistors (MESFETS) for high-frequency applications.

High electron mobility transistors fabricated in the gallium nitride/aluminum gallium nitride (GaN/AlGaN) material system can generate large amounts of RF power due to a combination of material characteristics, such as relatively high breakdown fields, relatively wide bandgaps, relatively large conduction band offset, and/or relatively high saturated electron drift velocity. A major portion of the electrons in the 2DEG may be attributed to polarization in the AlGaN.

HEMTs in the GaN/AlGaN system have already been demonstrated. For example, U.S. Pat. Nos. 5,192,987 and 5,296,395 describe AlGaN/GaN HEMT structures and methods of manufacture. In addition, U.S. Pat. No. 6,316,793, to Sheppard et al., which is commonly assigned and incorporated by reference herein, describes a HEMT device having a semi-insulating silicon carbide substrate, an aluminum nitride buffer layer on the substrate, an insulating gallium nitride layer on the buffer layer, an aluminum gallium nitride barrier layer on the gallium nitride layer, and a passivation layer on the aluminum gallium nitride active structure. Moreover, U.S. Patent Application Publication No. US2005/0170574 to Sheppard et al., which is also commonly assigned and incorporated by reference herein, describes a HEMT device including a protective layer and/or a low damage recess fabrication technique which may reduce damage to the semiconductor in the gate region of the transistor that may occur during an anneal of ohmic contacts of the device.

One step in the fabrication of HEMT devices is the formation of the gate electrode. Conventional methods of gate electrode formation may include depositing a dielectric, etching through the dielectric using a mask and/or other sacrificial layer, and depositing a T-shaped gate electrode (referred to as a "T-gate") into the etched portion of the dielectric. However, in such conventional methods, gaps may be formed between the edges of the dielectric and the gate electrode, due to isotropy of the dielectric etch. This may be detrimental to device operation, as the unpassivated semiconductor surface exposed by the gap may cause current collapse and/or drift in the device. In addition, although a passivation layer may be formed in the gap after formation of the gate, the passivation properties of such a post-gate passivation layer may be inferior to that of the initial pre-gate dielectric. This may be due to the fact that the pre-gate dielectric can be formed at relatively high temperatures, which may not be feasible once the gate metallization has been deposited.

Accordingly, other methods of gate electrode formation have been developed to prevent formation of such a gap. For example, the mask and/or other sacrificial layer may be removed from the dielectric prior to formation of the gate electrode in the etched portion of the dielectric. As such, the gate electrode may completely fill the etched portion of the dielectric, and "wings" or sidelobes of the gate electrode may be formed directly on the dielectric surface. Such a gate electrode is referred to as a dielectrically-supported T-gate, or a "gamma" gate. However, because portions of the dielectric may be sandwiched between the sidelobes and the substrate, gate-drain capacitance ($c_{gd}$) and/or gate-source capacitance ($c_{gs}$) may be increased, which may detrimentally affect device performance.

SUMMARY OF THE INVENTION

According to some embodiments of the present invention, methods for fabricating a transistor may include forming a protective layer on a substrate. The protective layer may have an opening extending therethrough. A gate electrode may be formed in the opening, for example, directly on opposing sidewalls of the protective layer. A first portion of the gate electrode may laterally extend on surface portions of the protective layer outside the opening, and a second portion of the gate electrode may be spaced apart from the protective layer and may laterally extend beyond the first portion.

In some embodiments, before the gate electrode is formed, a second layer may be formed on the protective layer. The second layer may have a second opening extending therethrough that is wider than the first opening. The gate electrode may be formed in the second opening, such that the second portion of the gate electrode may laterally extend on surface portions of the second layer outside the second opening.

In other embodiments, the second layer may be a material having a lower dielectric index than the protective layer.

In some embodiments, the second layer may be formed on the protective layer and may include a recess extending through the second layer. The recess may expose a portion of the protective layer. The recess in the second layer may be widened to define the second opening exposing the first opening and exposing surface portions of the protective layer on opposite sides of the first opening.

In other embodiments, the protective layer and the second layer may be formed of different materials. The protective layer may be patterned using the second layer as a mask to form the first opening extending through the protective layer prior to widening the recess in the second layer. The recess in the second layer may be widened by symmetrically expanding the recess in the second layer. As such, the second opening and the first opening may be self-aligned.

In some embodiments, the second layer may be a photoresist layer. The recess in the second layer may be widened by ashing the second layer using an oxygen plasma and/or by hard baking the substrate. In other embodiments, the second layer may be a polymide layer.

In other embodiments, the second layer may be a sacrificial layer. As such, the second layer may be removed after forming the gate electrode. A passivation layer may be formed on the protective layer and on the gate electrode after removing the second layer.

In still other embodiments, a channel layer may be formed on the substrate, and a barrier layer may be formed on the channel layer. The protective layer may be formed on the barrier layer. The gate electrode may be formed to extend through the opening in the protective layer to contact the barrier layer. A junction between the channel layer and the barrier layer may define a heterojunction.

In some embodiments, the channel layer may have a lower bandgap than the barrier layer.

In other embodiments, first and second ohmic contact regions may be formed on the barrier layer adjacent to and spaced apart from the protective layer. As such, the protective layer may be between the first and second ohmic contact regions. The first and second ohmic contact regions may be formed by patterning the protective layer to expose portions of the barrier layer, forming ohmic metal regions on the exposed portions of the barrier layer adjacent to and spaced apart from the patterned protective layer, and annealing the ohmic metal regions.

In some embodiments, the barrier layer may be formed of Group-III nitride layer, and the channel layer may be formed of an undoped Group-III nitride layer. For example, the barrier layer may be formed of aluminum gallium nitride (AlGaN), and the channel layer may be formed of gallium nitride (GaN). The protective layer may be a dielectric material, such as silicon nitride (SiN), aluminum nitride (AlN), and/or silicon dioxide ($SiO_2$).

According to further embodiments of the present invention, a method of fabricating a transistor may include forming a first layer on a substrate. The first layer may be a dielectric material. A second layer may be formed on the first layer. The second layer may have a hole therein exposing a portion of the first layer. A first opening extending through the first layer may be formed using the second layer as a mask. After forming the first opening, the hole in the second layer may be widened to form a second opening. The second opening may expose the first opening, as well as surface portions of the first layer on opposite sides of the first opening. A gate electrode may be formed in the first and second openings. For example, the gate electrode may be formed directly on opposing sidewalls of the first opening. First portions of the gate electrode may extend on surface portions of the first layer outside the first opening, and second portions of the gate electrode may extend on surface portions of the second layer outside the second opening.

In some embodiments, the first portions of the gate electrode may laterally extend on surface portions of the first layer outside the opening. The second portions of the gate electrode may laterally extend on the surface portions of the second layer outside the second opening beyond the first portions of the gate electrode.

In other embodiments, the first layer and the second layer may be formed of different materials. For example, the first layer may be formed of a dielectric material, such as silicon nitride, aluminum nitride, and/or silicon dioxide. The second layer may be formed of a material having a lower dielectric index than the first layer.

In some embodiments, the hole in the second layer may be widened by symmetrically expanding the hole in the second layer, such that the second opening and the first opening may be self-aligned.

In other embodiments, the second layer may be a photoresist layer. The hole in the second layer may be widened by ashing the second layer using an oxygen plasma and/or hard baking the substrate. In still other embodiments, the second layer may be a polyimide layer.

In some embodiments, the first layer may be patterned by selectively etching the portion of the first layer exposed by the hole using a low-damage etching technique to form the first opening.

In other embodiments, the hole in the second layer may be widened by selectively etching the second layer using a wet etch to form the second opening.

In some embodiments, a channel layer may be formed on the substrate, and a barrier layer may be formed on the channel layer. The first layer may be formed on the barrier layer. The gate electrode may be formed to extend through the first opening in the first layer to contact the barrier layer. A junction between the channel layer and the barrier layer may define a heterojunction.

According to other embodiments of the present invention, a transistor may include a substrate, a protective layer on the substrate, and a gate electrode. The protective layer may have an opening extending therethrough, and the gate electrode may be in the opening. For example, the gate electrode may be directly on opposing sidewalls of the opening in the protective layer. The gate electrode may include a first portion laterally extending on surface portions of the protective layer outside the opening, and a second portion spaced apart from the protective layer and laterally extending beyond the first portion.

In some embodiments, the transistor may include a second layer on the protective layer. For example, the second layer may be a sacrificial layer. The second layer may have a lower dielectric index than the protective layer. The second layer may have a second opening extending therethrough that is wider than the first opening. The gate electrode may be in the second opening, and the second portion of the gate electrode may laterally extend on portions of the second layer outside the second opening. The first and second openings may define a stair-step profile.

In other embodiments, the transistor may include a passivation layer on the protective layer and on the gate electrode. The protective layer and the passivation layer may be formed of a same material.

In still other embodiments, the transistor may include a channel layer on the substrate, and a barrier layer on the channel layer. The protective layer may be on the barrier layer. The gate electrode may extend through the opening in the protective layer to contact the barrier layer. The channel layer and the barrier layer may be configured to provide a High Electron Mobility Transistor (HEMT). For example, the channel layer and the barrier layer have different lattice constants, and as such, may provide a pseudomorphic HEMT.

In some embodiments, the transistor may include first and second ohmic contact regions on the barrier layer. The first and second ohmic contact regions may be on opposite sides of the gate electrode and spaced apart from the protective layer.

The protective layer may have a thickness of at least about a thickness of the ohmic contact regions.

In other embodiments, the barrier layer may be a Group-III nitride layer, and the channel layer may be an undoped Group-III nitride layer. For example, the barrier layer may be aluminum gallium nitride (AlGaN), and the channel layer may be gallium nitride (GaN). The protective layer may be a dielectric material. For example, the protective layer may be silicon nitride, aluminum nitride, and/or silicon dioxide. In other embodiments, the substrate may be silicon carbide.

DETAILED DESCRIPTION OF EMBODIMENTS OF THE INVENTION

Figure 1:
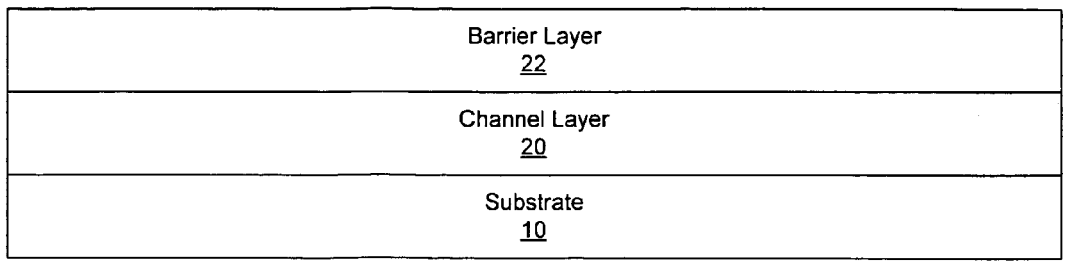
FIGS. 1 to 9 are cross-sectional views illustrating exemplary intermediate fabrication steps in operations for fabricating transistor devices according to some embodiments of the present invention.

The present invention now will be described more fully hereinafter with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

It will also be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

The terminology used in the description of the invention herein is for the purpose of describing particular embodiments only and is not intended to be limiting of the invention. As used in the description of the invention and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant. concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms used in disclosing embodiments of the invention, including technical and scientific terms, have the same meaning as commonly understood by one of ordinary skill in the art to which this invention belongs, and are not necessarily limited to the specific definitions known at the time of the present invention being described. Accordingly, these terms can include equivalent terms that are created after such time. It will be further understood that terms, such as those defined in commonly used dictionaries, should be interpreted as having a meaning that is consistent with their meaning in the present specification and in the context of the relevant art and will not be interpreted in an idealized or overly formal sense unless expressly so defined herein. All publications, patent applications, patents, and other references mentioned herein are incorporated by reference in their entirety.

Embodiments of the present invention may be particularly well suited for use in nitride-based HEMTs, such as Group III-nitride based devices. As used herein, the term "Group III nitride" refers to those semiconducting compounds formed between nitrogen and the elements in Group III of the periodic table, usually aluminum (Al), gallium (Ga), and/or indium (In). The term also refers to ternary and quaternary compounds such as AlGaN and AlInGaN. As is well understood by those in this art, the Group III elements can combine with nitrogen to form binary (e.g., GaN), ternary (e.g., AlGaN, AlInN), and quaternary (e.g., AlInGaN) compounds. These compounds may all have empirical formulas in which one mole of nitrogen is combined with a total of one mole of the Group III elements. Accordingly, formulas such as $Al_xGa_{1-x}N$, where $0 \leq x \leq 1$, may be used to describe these compounds.

Suitable structures for GaN-based HEMTs that may utilize embodiments of the present invention are described, for example, in commonly assigned U.S. Pat. No. 6,316,793 and U.S. Patent Publication No. 2002/0066908A1 filed Jul. 12, 2001 and published Jun. 6, 2002, for "ALUMINUM GALLIUM NITRIDE/GALLIUM NITRIDE HIGH ELECTRON MOBILITY TRANSISTORS HAVING A GATE CONTACT ON A GALLIUM NITRIDE BASED CAP SEGMENT AND METHODS OF FABRICATING SAME", United States Patent Publication No. 2002/0167023A1 to Smorchkova et al., published Nov. 14, 2002, entitled "GROUP-III NITRIDE BASED HIGH ELECTRON MOBILITY TRANSISTOR (HEMT) WITH BARRIER/SPACER LAYER", and U.S. patent application Ser. No. 10/617,843 filed Jul. 11, 2003 for "NITRIDE-BASED TRANSISTORS AND METHODS OF FABRICATION THEREOF USING NON-ETCHED CONTACT RECESSES," the disclosures of which are hereby incorporated herein by reference in their entirety.

Some embodiments of the present invention may arise from a realization that, for devices operating at relatively high frequencies (for example, above the X-band frequency range), and particularly for millimeter wave radio frequency (RF) devices, a tradeoff may exist between minimizing peak electric fields and/or surface-related trapping and maintaining relatively low capacitance values. Accordingly, some embodiments of the present invention provide a transistor device that combines some of the positive aspects of a T-gate (such as relatively low gate resistance and/or relatively low $c_{gd}$ and $c_{gs}$) with some of the positive attributes of a gamma gate (such as pre-gate passivation and/or peak electric field reduction).

FIGS. 1 to 9 are cross-sectional views illustrating exemplary intermediate fabrication steps in methods for fabricating transistor devices according to some embodiments of the present invention. Referring now to FIG. 1, a substrate 10 is provided on which a transistor device may be formed. A channel layer 20 is formed on the substrate 10, and a barrier layer 22 is formed on the channel layer 20. The substrate 10 may be a semi-insulating silicon carbide (SiC) substrate that may be, for example, the 4H polytype of silicon carbide. Other silicon carbide candidate polytypes may include the 3C, 6H, and 15R polytypes. The term "semi-insulating" is used descriptively herein, rather than in an absolute sense. In some embodiments of the present invention, the silicon carbide bulk crystal may have a resistivity equal to or higher than about $1 \times 10^5$ Ω-cm at room temperature.

Silicon carbide has a much closer crystal lattice match to Group III nitrides (which may be employed in the channel layer 20 and/or the barrier layer 22) than does sapphire ($Al_2O_3$), which may be a common substrate material for Group III nitride devices. The closer lattice match may result in Group III nitride films of higher quality than those generally available on sapphire. Silicon carbide also has a relatively high thermal conductivity, and as such, the total output power of Group III nitride devices formed on silicon carbide may not be as limited by thermal dissipation of the substrate as similar devices formed on sapphire. Also, semi-insulating silicon carbide substrates may provide for device isolation and reduced parasitic capacitance. Exemplary SiC substrates that may be used in some embodiments of the present invention are manufactured by, for example, Cree, Inc., of Durham, N.C., the assignee of the present invention, and methods for producing such substrates are described, for example, in U.S. Pat. No. Re. 34,861; U.S. Pat. Nos. 4,946,547; 5,200,022; and 6,218,680, the disclosures of which are incorporated by reference herein in their entireties. Similarly, techniques for epitaxial growth of Group III nitrides have been described in, for example, U.S. Pat. Nos. 5,210,051; 5,393,993; 5,523,589; and 5,292,501, the disclosures of which are also incorporated by reference herein in their entireties.

It is to be understood that, although silicon carbide may be employed as a substrate, embodiments of the present invention may utilize any suitable substrate for the substrate 10, such as sapphire ($Al_2O_3$), aluminum nitride (AlN), aluminum gallium nitride (AlGaN), gallium nitride (GaN), silicon (Si), gallium arsenide (GaAs), LGO, zinc oxide (ZnO), LAO, indium phosphate (InP), and the like.

Optional buffer, nucleation and/or transition layers (not shows) may also be provided on the substrate 10. For example, an AlN buffer layer may be provided to provide an appropriate crystal structure transition between a silicon carbide substrate and the remainder of the device. Additionally, strain balancing transition layer(s) may also be provided as described, for example, in commonly assigned United States Patent Publication 2003/0102482A1, filed Jul. 19, 2002 and published Jun. 5, 2003, and entitled "STRAIN BALANCED NITRIDE HETROJUNCTION TRANSISTORS AND METHODS OF FABRICATING STRAIN BALANCED NITRIDE HETEROJUNCTION TRANSISTORS, and U.S. Provisional Patent Application Ser. No. 60/337,687, filed Dec. 3, 2001 and entitled "STRAIN BALANCED NITRIDE HETEROJUNCTION TRANSISTOR," the disclosures of which are incorporated by reference herein as if set forth fully herein.

Still referring to FIG. 1, a channel layer 20 is provided on the substrate 10. The channel layer 20 may be deposited on the substrate 10 using buffer layers, transition layers, and/or nucleation layers as described above. The channel layer 20 may be under compressive strain. Furthermore, the channel layer 20 and/or buffer, nucleation, and/or transition layers may be deposited by metal-organic chemical vapor deposition (MOCVD) or by other techniques known to those of skill in the art, such as molecular beam epitaxy (MBE) and/or hydride vapor phase epitaxy (HVPE). In some embodiments of the present invention, the channel layer 20 may be a Group III-nitride layer, such as GaN. The channel layer 20 may also include other Group III-nitride layers, such as indium gallium nitride (InGaN), aluminum indium gallium nitride (AlInGaN), or the like. The channel layer 20 may be undoped (i.e., "unintentionally doped"), and may be grown to a thickness of greater than about 20 Å. The channel layer 20 may also be a multi-layer structure, such as a superlattice or combinations of GaN, AlGaN, or the like.

As further shown in FIG. 1, a barrier layer 22 is provided on the channel layer 20. For example, the barrier layer 22 may be deposited on the channel layer 20. The barrier layer 22 may be a Group III-nitride layer, such as $Al_xGa_{1-x}N$ (where $0<x<1$). The barrier layer 22 may also include other Group III-nitride layers, such as AlInGaN, AlN, and/or combinations of layers thereof. The barrier layer 22 may, for example, be from about 0.1 nm to about 100 nm thick, but may not be so thick as to cause cracking or substantial defect formation therein. In certain embodiments of the present invention, the barrier layer 22 may be a highly-doped n-type layer. For example, the barrier layer 22 may be doped to a concentration of less than about $10^{19}$ cm$^{-3}$.

Some embodiments of the present invention may be applicable in high electron mobility transistors (HEMTs). More particularly, the channel layer 20 and the barrier layer 22 may be formed of materials having different bandgaps, such that an interface between the channel layer and the barrier layer defines a heterojunction. For example, the channel layer 20 may have a bandgap that is less than the bandgap of the barrier layer 22. As such, the energy of the conduction band edge of the channel layer 20 may be less than the energy of the conduction band edge of the barrier layer 22 at the junction between the channel 20 and barrier 22 layers, and the channel layer 20 may have a greater electron affinity than the barrier layer 22. For example, where both the channel layer 20 and the barrier layer 22 are formed of Group III-nitride layers, the channel layer 20 may be a GaN layer, and the barrier layer 22 may be a AlGaN layer.

Examples of layers according to certain embodiments of the present invention are described in United States Patent Publication No. 2002/0167023A1, to Smorchkova et al., entitled "GROUP-III NITRIDE BASED HIGH ELECTRON MOBILITY TRANSISTOR (HEMT) WITH BARRIER/SPACER LAYER" the disclosure of which is incorporated herein by reference as if set forth fully herein. In particular embodiments of the present invention, the barrier layer 22 may have a thickness, Al composition, and/or doping sufficient to induce a significant carrier concentration at the interface between the channel layer 20 and the barrier layer 22 through polarization effects when the barrier layer 22 is buried under ohmic contact metal. Also, the barrier layer 22 may be thick enough to reduce or minimize scattering of electrons in the channel due to ionized impurities deposited at the interface between the barrier layer 22 and a subsequently formed protective layer.

In addition, in other embodiments of the present invention, the channel layer 20 and the barrier layer 22 may have different lattice constants. For example, the barrier layer 22 may be a relatively thin layer having a smaller lattice constant than the channel layer 20, such that the barrier layer 22 "stretches" at the interface between the two. Accordingly, a pseudomorphic HEMT (pHEMT) device may be provided.

Figure 2:
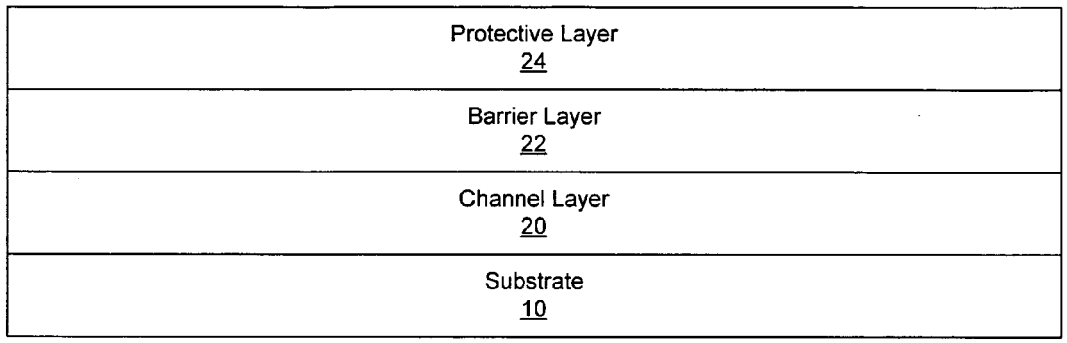

FIG. 2 illustrates formation of a protective layer 24 on the barrier layer 22. The protective layer 24 may be dielectric material, such as silicon nitride ($Si_xN_y$), aluminum nitride (AlN), silicon dioxide ($SiO_2$), and/or other suitable protective material. Other materials may also be utilized for the protective layer 24. For example, the protective layer 24 may also include magnesium oxide, scandium oxide, aluminum oxide and/or aluminum oxynitride. Furthermore, the protective layer 24 may be a single layer or may include multiple layers of uniform and/or non-uniform composition.

The protective layer 24 may be blanket formed on the barrier layer 22. For example, the protective layer 24 may be a silicon nitride (SiN) layer formed by high quality sputtering and/or plasma-enhanced chemical vapor deposition (PECVD). The protective layer 24 may have a thickness of about 30 nm, however, other thickness layers may also be utilized. For example, the protective layer may be sufficiently thick so as to protect the underlying layer during a subsequent anneal of ohmic contacts. Layers as thin as two or three monolayers may be sufficient for such purposes. However, in general, the protective layer 24 may have a thickness of from about 10 nm to about 500 nm. Also, a high quality SiN protective layer may be grown in-situ with the MOCVD growth of the group III nitride layers.

In particular embodiments of the present invention, the protective layer 24 may be SiN. The SiN protective layer may be formed by PVD and/or CVD and may be non-stoichiometric in compressive or tensile strain. For example, the SiN protective layer may have a stress of between about −100 MPa and about 100 MPa. In certain embodiments of the present invention, the SiN protective layer may have an index of refraction at a 633 nm wavelength of from about 1.6 to about 2.2. In particular embodiments, the index of refraction of the SiN protective layer may be 1.98±0.05.

Figure 3:
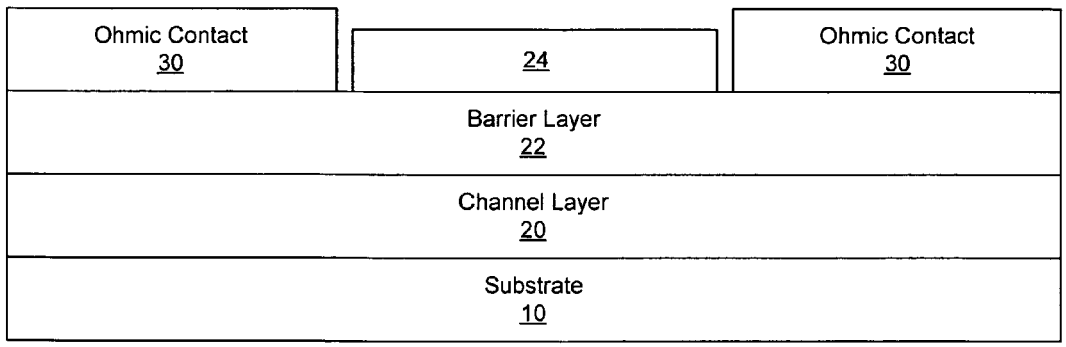

FIG. 3 illustrates formation of ohmic contact regions 30 on the barrier layer 22. Referring now to FIG. 3, the protective layer 24 is patterned to expose portions of the barrier layer 22, and first and second ohmic contact regions 30 are formed on the barrier layer 22. For example, windows may be etched into the protective layer 24 to expose the underlying barrier layer 22. The windows may be etched utilizing a patterned mask and a low-damage etch with respect to the barrier layer 22. Examples of low damage etch techniques may include etching techniques other than reactive ion etching, such as inductively coupled plasma or electron cyclotron resonance (ECR) or downstream plasma etching with no DC component to the plasma. For example, for a $SiO_2$ barrier layer, a wet etch with buffered hydrofluoric acid may be used. A selective etch of SiN and/or $SiO_2$ to an etch stop layer, such as ITO, SCO, MgO or the like, followed by a low damage removal of the etch stop layer may also be performed. For a SiN barrier layer, $SiO_2$ may be used as an etch stop layer. In such embodiments, the protective layer 24 may include the SiN, AlN, and/or $SiO_2$ layers, as well as the etch stop layer. Thus, in certain embodiments of the present invention, the protective layer 24 may include multiple layers.

Still referring to FIG. 3, using a subsequent photolithography step and evaporation, ohmic metal is formed on the exposed portions of the barrier layer 22. The ohmic metal is patterned so as to be smaller than the window in the protective layer 24, and the ohmic metal is annealed to provide the first and second ohmic contact regions 30. As such, the edges of the ohmic contact regions 30 may be spaced apart from the adjacent protective layer 24.

The anneal may be a relatively high temperature anneal. For example, the anneal may be performed at a temperature of greater than about 900° C. By using such an ohmic contact anneal, the resistance of the ohmic contact regions 30 may be reduced from a relatively high resistance to, for example, less than about 1 Ω-mm. Thus, as used herein, the term "ohmic contact" may refer to a non-rectifying contact that has a contact resistance of less than about 1 Ω-mm. The presence of the protective layer 24 during the high temperature process steps may reduce and/or inhibit damage to the barrier layer 22 that may be caused by such steps. Thus, for example, the sheet resistance of the gate region after the high temperature ohmic contact anneal may be substantially the same as the sheet resistance of the gate region as-grown (i.e. before the contact anneal).

The ohmic contact regions 30 may be spaced apart from the protective layer 24 by a distance that is sufficient to allow for misalignment tolerances in the formation and/or patterning of the ohmic contact metal. For example, the edges of the ohmic contact regions 30 may be spaced apart from the protective layer 24 by a distance of about 0.1 micrometer (μm) to about 0.2 μm. It may be desirable to prevent contact between the ohmic metal and the protective layer 24 to reduce the likelihood of the metal diffusing into the protective layer 24 during subsequent heating steps, which may result in a short between a gate contact and the ohmic contact region(s) 30. However, the gaps between the ohmic contact regions 30 and the protective layer 24 need not be so large as to defeat the protective purpose of the protective layer 24 (and/or substantially degrade the performance of the device), but may not be so small as to risk contact between the ohmic material and the protective layer 24. Thus, in certain embodiments of the present invention, the gaps may be in the range of about 0.1 micrometer (µm) to about 0.5 µm.

Figure 4:
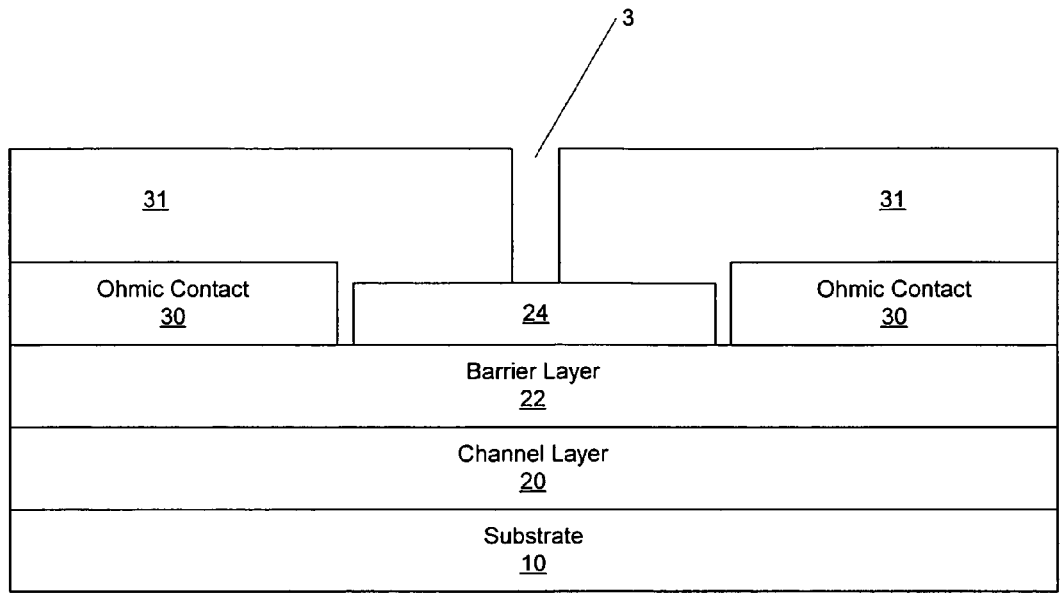

FIG. 4 illustrates the formation of a second layer 31 on the ohmic contact regions 30 and the protective layer 24. The second layer 31 may be a dielectric layer having a lower dielectric index than the protective layer 24. The second layer 31 may also be a sacrificial layer, which may be removed in a subsequent step. For example, the second layer 31 may be a photoresist layer. Also, the second layer 31 may be a polymide layer. As shown in FIG. 4, the second layer 31 includes a hole or recess 3 that extends through the second layer 31 and exposes a portion of the protective layer 24. For example, the second layer 31 may be photolithographically patterned to form the recess 3.

Figure 5:
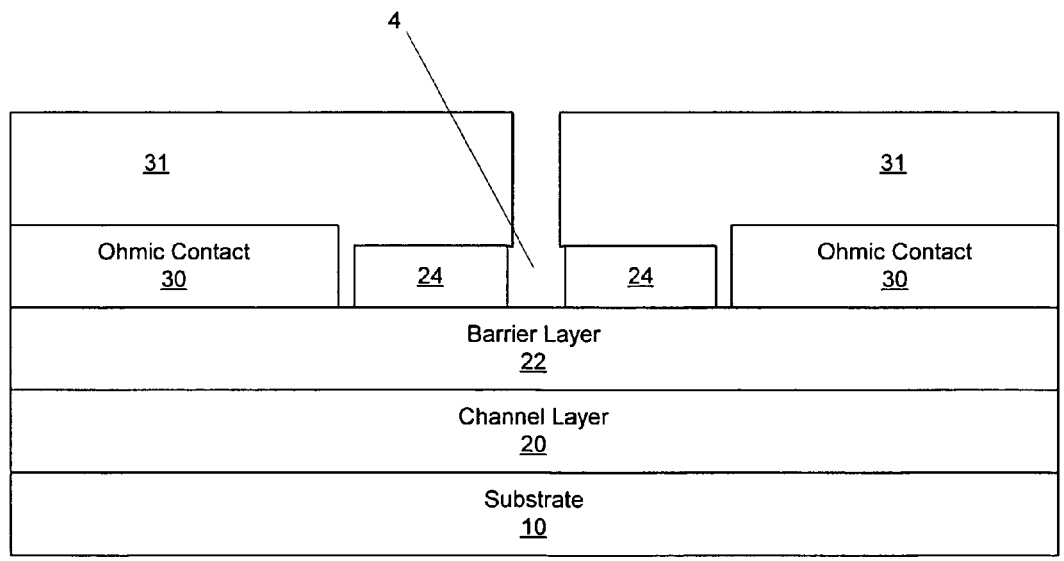

FIG. 5 illustrates the formation of an opening or "window" in the protective layer 24, where the gate electrode may be formed in a subsequent step. As shown in FIG. 5, an opening 4 is formed extending through the protective layer 24 to expose a portion of the barrier layer 22. More particularly, the exposed portion of the protective layer 24 is patterned using the second layer 31 as a mask to form the opening 4. The opening 4 may be formed by selectively etching the portion of the protective layer 24 exposed by the recess 3 in the second layer 31 using a low damage etch technique, as described above, to facilitate the formation of a low-leakage Schottky gate contact on the exposed surface of the barrier layer 22. Note that the opening 4 in the protective layer 24 may be wider than the recess 3 in the second layer 31, due to isotropy (i.e., undercutting) of the etch. In particular embodiments, the ohmic contacts 30 may provide source and drain contacts, and the opening 4 may be offset between the source and drain contacts such that the opening 4, and subsequently the gate contact, may be closer to the source contact than the drain contact.

Figure 6:
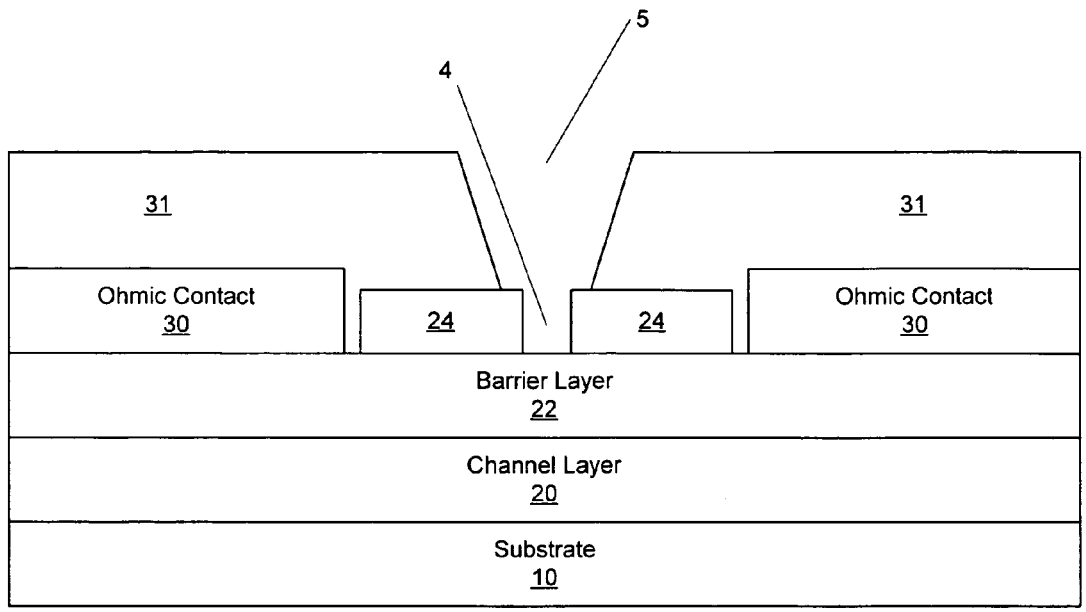

Referring now to FIG. 6, the recess 3 in the second layer 31 is widened to define a second opening 5 that is wider than the first opening 4. As such, the second opening 5 exposes the first opening 4 as well as surface portions of the protective layer 24 on opposite sides of the first opening 4. The recess 3 in the second layer 31 may be symmetrically expanded so that the second opening 5 and the first opening 4 are self-aligned. For example, where the second layer 31 is formed of a different material than the protective layer 24, the recess 3 in the second layer 31 may be widened by selectively etching the second layer 31 using a wet etching technique. In addition or in an alternative, where the second layer 31 is a photoresist layer, the recess may be widened by ashing the second layer 31 using an oxygen plasma and/or hard baking the device, for example, at a temperature above 100 degrees Celsius (C) but below 150 degrees C.

Accordingly, as shown in FIGS. 5 and 6, the protective layer 24 may be selectively etched using the second layer 31 as a mask to form the first opening 4, and the recess 3 in the second layer 31 may be selectively widened around the first opening 4 to form the second opening 5. As such, the first opening 4 and the second opening 5 may be self-aligned. In some embodiments, the second layer 31 may be any material which may be selectively etched relative to the protective layer 24.

Figure 7:
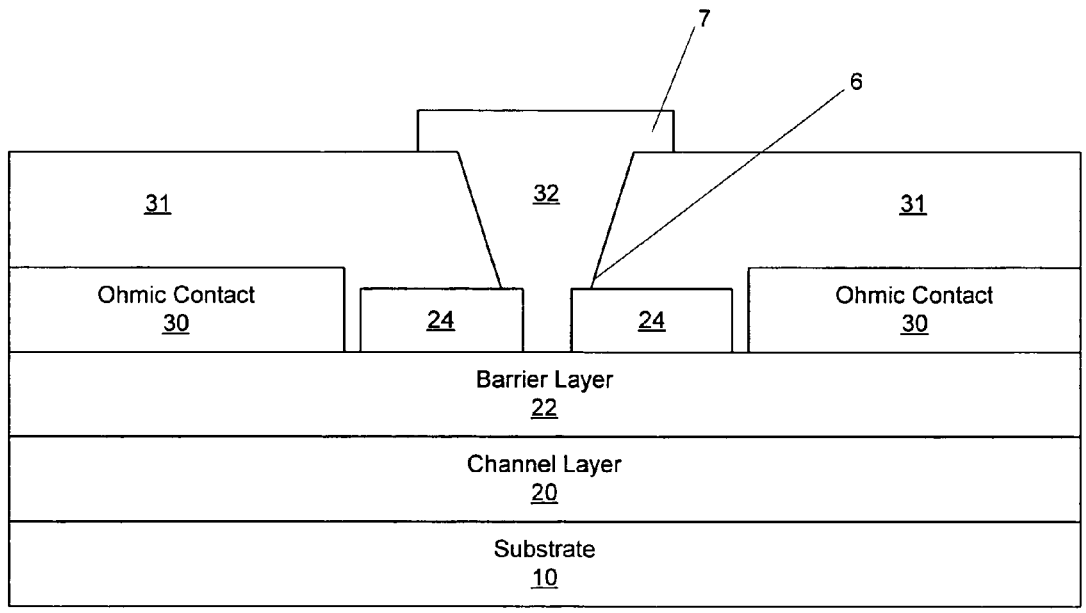

FIG. 7 illustrates the formation of a gate electrode 32. As shown in FIG. 7, the gate electrode 32 is formed in the second opening 5 and the first opening 4, and extends through the protective layer 24 to contact the exposed portion of the barrier layer 22. The gate electrode 32 may be formed in the first opening 4 directly on opposing sidewalls of the protective layer 24, such that a gap may not be formed between the two. Suitable gate materials may depend on the composition of the barrier layer 24. However, in certain embodiments, conventional materials capable of making a Schottky contact to a nitride based semiconductor material may be used, such as Ni, Pt, $NiSi_x$, Cu, Pd, Cr, TaN, W and/or WSiN.

Still referring to FIG. 7, first portions 6 (also referred to as "wings" or "sidelobes") of the gate electrode 32 laterally extend on surface portions of the protective layer 24 outside the first opening 4, and second portions 7 of the gate electrode 32 that are spaced vertically apart from the protective layer 24 laterally extend on surface portions of the second layer 31 outside the second opening 5. As used herein, the term "laterally" refers to a direction that is substantially parallel with respect to a surface of the substrate. The second portions 7 of the gate electrode 32 may laterally extend beyond the first portions 6. Because the first opening 4 and the second opening 5 may be self-aligned by the processes described thus far, the length by which the first portions 6 of the gate electrode 32 extend onto the protective layer 24 may be controlled. As such, according to some embodiments of the present invention, gate-to-drain capacitance ($c_{gd}$) and/or gate-to-source capacitance ($c_{gs}$) of the transistor device that may be caused by the extension of the gate electrode 32 onto the protective layer 24 may also be controlled. Accordingly, a modified gamma gate 32 having self-aligned sidelobes 6 may be formed.

Figure 8:
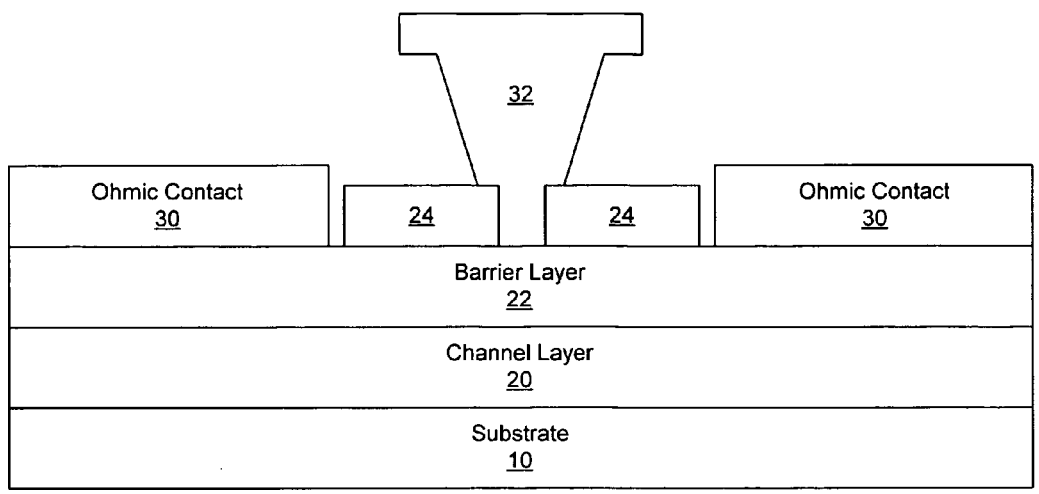

FIG. 8 illustrates removal of the sacrificial second layer 31. As shown in FIG. 8, the second layer 31 is removed after the gate electrode 32 is formed. The second layer 31 may be formed using conventional techniques, depending on the composition of the second layer 31.

Figure 9:
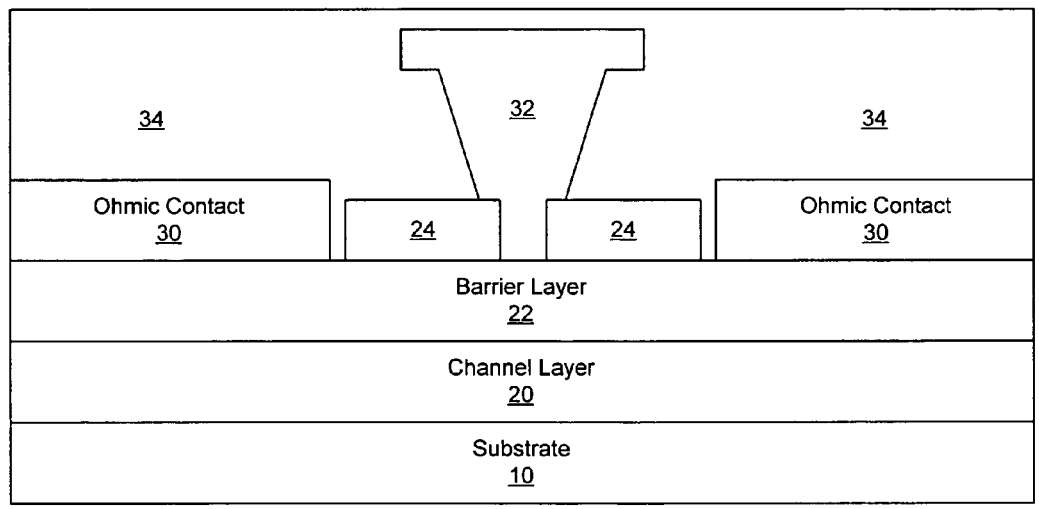

FIG. 9 illustrates the formation of a passivation layer 34. The passivation layer 34 may provide environmental protection for the transistor device. For example, the passivation layer 34 may be a thicker nitride or relatively low-k encapsulation layer, and may be formed to improve coverage of the protective layer 24. The passivation layer 34 may be blanket deposited on the structure of FIG. 8 after removal of the second layer 31. As such, the second portions 7 of the gate electrode 32 laterally extend on portions of the passivation layer 34. In particular embodiments, the passivation layer 34 may be deposited so as to substantially fill the gaps between the protective layer 24 and the ohmic contacts 30. In certain embodiments of the present invention, the passivation layer 34 may be silicon nitride, aluminum nitride, silicon dioxide, and/or an oxynitride. Furthermore, the passivation layer 34 may be a single or multiple layers of uniform and/or non-uniform composition.

Figure 10:
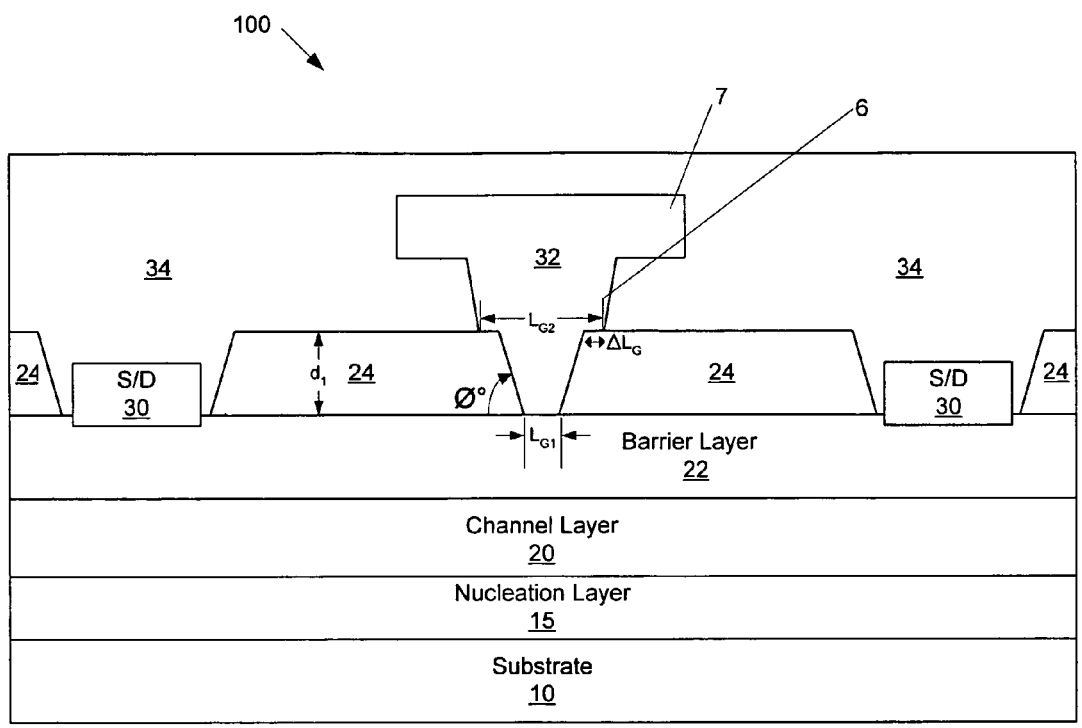
FIG. 10 is a cross-sectional view illustrating a transistor device according to some embodiments of the present invention.

FIG. 10 is a cross-sectional view illustrating a high electron mobility transistor (HEMT) device 100 according to further embodiments of the present invention. As shown in FIG. 10, the gate electrode 32 of the HEMT device 100 extends through the protective layer 24 to contact the barrier layer 22. The gate electrode 32 includes first portions 6 laterally extending on surface portions of the protective layer 24 outside the opening therein, and second portions 7 spaced vertically apart from the protective layer 24 by the passivation layer 34 and laterally extending on portions of the passivation layer 34 beyond the first portions 6. In other words, the first and second portions 6 and 7 of the gate electrode 32 define a stair-step profile. The second portions 7 of the gate electrode 32 may be spaced apart from the protective layer 24 by about 4000 Angstroms (Å) to about 6000 Å. The gate electrode 32 also extends directly on opposing sidewalls of the opening in the protective layer 24, such that a gap may not be present between the gate electrode 24 and the protective layer 24. The first portions 6 of the gate electrode 32 may also be formed directly on the protective layer 24.

In addition, because the first opening (in the protective layer 24) and the second opening (in the second layer 31 of FIG. 6) may be self-aligned by the processes described above, a width of the second opening (illustrated as $L_{G2}$) may be self-aligned and symmetric around a width of the first opening, which defines the gate length $L_{G1}$. As such, the gate length $L_{G1}$ may be tuned for an operational frequency of interest based on formation of the opening in the protective layer 24. For example, the gate length $L_{G1}$ may be about 0.05 micrometer (μm) to about 2.0 μm. In addition, a length $\Delta L_G$ by which the first portion 6 of the gate electrode 32 extends onto the protective layer 24 may also be controlled, by widening the opening in the sacrificial second layer, as described above. The thickness $d_1$ of the protective layer 24 and the length $\Delta L_G$ of first portion of the gate electrode 32 may be optimized to reliably support the peak gate-to-drain voltage $V_{GD}$ and to minimize and/or reduce the gate-to-drain capacitance $c_{gd}$ and the gate-to-source capacitance $c_{gs}$. For example, the length $\Delta L_G$ may be about 0.1 micrometer (μm) to about 0.6 μm, and the thickness $d_1$ may be about 300 Angstroms (Å) to about 5000 Å. In addition, the angle Ø of the sidewalls of the protective layer 24 defining the first opening may also be optimized, for example, between about 45 degrees to about 90 degrees.

As described above, in some embodiments, the protective layer 24 may be SiN, the barrier layer 22 may be AlGaN, and the channel layer 20 may be GaN. The transistor 100 also includes a nucleation layer 15 between the substrate 10 and the channel layer 20, as also discussed above.

Also, FIG. 10 illustrates that the ohmic contact regions may be source/drain contact regions 30. The protective layer 24 may be formed to a thickness that is at least about as thick as the ohmic contact regions. For example, the protective layer 24 may be formed to a thickness in the range of about 500 Angstroms (Å) to about 5000 Å. In addition, the passivation layer 34 may substantially fill the gap between the protective layer 24 and the source/drain regions 30. In certain embodiments of the present invention, the passivation layer 34 may be formed of the same material as the protective layer 24. As such, the passivation layer 34 may be silicon nitride, aluminum nitride, silicon dioxide and/or an oxynitride. Furthermore, the passivation layer 34 may be a single or multiple layers of uniform and/or non-uniform composition.

Thus, some embodiments of the present invention combine many of the positive qualities of a T-gate with those of a dielectrically-supported gate electrode, or gamma gate. Accordingly, a modified gamma gate structure with self-aligned wings/sidelobes is provided having relatively low gate resistance, relatively low gate-to-drain and/or gate-to-source capacitance, and relatively high gain. In addition, gaps between the gate electrode and the protective layer may be reduced and/or avoided, and the peak electric fields may be reduced.

While embodiments of the present invention have been described herein with reference to particular HEMT structures, the present invention should not be construed as limited to such structures, and may be applied to formation of gate electrodes in many different transistor structures, such as pseudomorphic HEMTs (pHEMTs) (including GaAs/AlGaAs pHEMTs) and/or GaN MESFETs. More generally, embodiments of the present invention may be applied in any electronic device where a gate electrode may be formed and/or where preservation of the as-grown surface properties may be imperative. For example, silicon nitride and/or other removable encapsulant can be used in the fabrication sequence of AlGaN metal-semiconductor-metal (MSM) detectors or power switching Schottky diodes.

Also, additional layers may be included in transistor devices while still benefiting from the teachings of the present invention. Such additional layers may include GaN cap layers, as for example, described in Yu et al., "Schottky barrier engineering in III-V nitrides via the piezoelectric effect," Applied Physics Letters, Vol. 73, No. 13, 1998, or in U.S. Patent Publication No. 2002/0066908A1 published Jun. 6, 2002, for "ALUMINUM GALLIUM NITRIDE/GALLIUM NITRIDE HIGH ELECTRON MOBILITY TRANSISTORS HAVING A GATE CONTACT ON A GALLIUM NITRIDE BASED CAP SEGMENT AND METHODS OF FABRICATING SAME," the disclosures of which are incorporated by reference as if set forth fully herein. In some embodiments, insulating layers such as $SiN_x$, or relatively high quality AlN may be deposited for making a MISHEMT and/or passivating the surface. The additional layers may also include a compositionally graded transition layer or layers. In addition, the barrier layer 22 described above may also include multiple layers. Thus, embodiments of the present invention should not be construed as limiting the barrier layer to a single layer but may include, for example, barrier layers having combinations of GaN, AlGaN and/or AlN layers. For example, a GaN, AlN structure may be utilized to reduce or prevent alloy scattering.

In the drawings and specification, there have been disclosed typical embodiments of the invention, and, although specific terms have been employed, they have been used in a generic and descriptive sense only and not for purposes of limitation.

That which is claimed is:

1. A method of fabricating a transistor, the method comprising:
    forming a first layer, wherein the first layer comprises a dielectric material;
    forming a second layer on the first layer, wherein the second layer has a hole therein exposing a portion of the first layer;
    forming a first opening extending through the first layer using the second layer as a mask;
    after forming the first opening, widening the hole in the second layer to form a second opening exposing the first opening and exposing surface portions of the first layer on opposite sides of the first opening; and
    forming a gate electrode in the first and second openings, wherein first portions of the gate electrode extend on surface portions of the first layer outside the first opening and second portions of the gate electrode extend on surface portions of the second layer outside the second opening.

2. The method of claim 1, wherein the first portions of the gate electrode laterally extend on surface portions of the first layer outside the first opening, wherein the second portions of the gate electrode laterally extend on the surface portions of the second layer outside the second opening beyond the first portions of the gate electrode.

3. The method of claim 1, wherein forming the gate electrode further comprises:
    forming the gate electrode in the first opening directly on opposing sidewalls thereof.

4. The method of claim 1, wherein the first layer comprises silicon nitride, aluminum nitride, and/or silicon dioxide.

5. The method of claim 1, wherein the first layer and the second layer comprise different materials, and wherein the second layer comprises a material having a lower dielectric index than the first layer.

6. The method of claim 1, wherein widening the hole in the second layer comprises:
symmetrically expanding the hole in the second layer so that the second opening and the first opening are self-aligned.

7. The method of claim 1, wherein the second layer comprises a photoresist layer.

8. The method of claim 7 wherein widening the hole in the second layer comprises:
ashing the second layer using an oxygen plasma and/or hard baking the second layer.

9. The method of claim 1, wherein widening the hole in the second layer comprises selectively etching the second layer using a wet etch to form the second opening therein.

10. The method of claim 1, further comprising:
forming a channel layer; and
forming a barrier layer on the channel layer,
wherein forming the first layer comprises forming the first layer on the barrier layer, wherein forming the gate electrode comprises forming the gate electrode extending through the first opening in the first layer to contact the barrier layer, and wherein a junction between the channel layer and the barrier layer define a heterojunction.

11. The method of claim 1, further comprising:
removing the second layer after forming the gate electrode.

12. The method of claim 11, further comprising:
forming a passivation layer on the first layer and on the gate electrode after removing the second layer.

13. A method of fabricating a transistor, the method comprising:
forming a channel layer;
forming a barrier layer on the channel layer, wherein a junction between the channel layer and the barrier layer define a heterojunction;
forming a protective layer on the barrier layer, the protective layer having an opening extending therethrough;
forming first and second ohmic contact regions on the barrier layer adjacent to and spaced apart from the protective layer so that the protective layer is between the first and second ohmic contact regions; and
forming a gate electrode extending through the opening in the protective layer to contact the barrier layer and so that a first portion of the gate electrode laterally extends on surface portions of the protective layer outside the opening and so that a second portion of the gate electrode spaced apart from the protective layer laterally extends beyond the first portion,
wherein forming the first and second ohmic contact regions comprises:
patterning the protective layer to expose portions of the barrier layer;
forming ohmic metal regions on the exposed portions of the barrier layer adjacent to and spaced apart from the patterned protective layer; and
annealing the ohmic metal regions.

* * * * *

UNITED STATES PATENT AND TRADEMARK OFFICE
CERTIFICATE OF CORRECTION

PATENT NO. : 7,592,211 B2 Page 1 of 1
APPLICATION NO. : 11/333726
DATED : September 22, 2009
INVENTOR(S) : Sheppard et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 601 days.

Signed and Sealed this

Twenty-first Day of September, 2010

David J. Kappos
*Director of the United States Patent and Trademark Office*